United States Patent [19]

Wolf

[11] Patent Number: 4,722,088
[45] Date of Patent: Jan. 26, 1988

[54] SEMICONDUCTOR LASER FOR HIGH OPTICAL OUTPUT POWER WITH REDUCED MIRROR HEATING

[75] Inventor: Hans D. Wolf, Hohenbrunn, Fed. Rep. of Germany

[73] Assignee: Siemens Aktiengesellschaft, Berlin and Munich, Fed. Rep. of Germany

[21] Appl. No.: 773,034

[22] Filed: Sep. 6, 1985

[30] Foreign Application Priority Data

Sep. 14, 1984 [DE] Fed. Rep. of Germany ..... 34339027

[51] Int. Cl.$^4$ ............................................... H01S 3/19
[52] U.S. Cl. ......................................... 372/44; 372/50
[58] Field of Search ........................ 372/43, 44, 45, 50

[56] References Cited

U.S. PATENT DOCUMENTS

| | | | |
|---|---|---|---|
| 4,349,905 | 9/1982 | Ackley | 372/45 |
| 4,371,966 | 2/1983 | Scifres et al. | 372/45 |
| 4,546,480 | 10/1985 | Burnham et al. | 372/45 |
| 4,594,718 | 6/1986 | Scifres et al. | 312/45 |

FOREIGN PATENT DOCUMENTS 115390 8/1984 European Pat Off.

OTHER PUBLICATIONS

Yonezu et al, "An AlGaAs Window Structure Laser" *IEEE Journal of Quantum Electronics*, v. QE-15, No. 8, Aug. 1979, pp. 775-781.

Yonezu et al, "High Optical Power Density Emission from a 'Window-Stripe' AlGaAs Double-Heterostructure Laser" *Applied Physics Letters*, V. 34(10), May 15, 1979, pp. 637-639.

Iwamura et al, "A Segmented Electrode Multi-Quantum-Well Laser Diode" *Japanese Journal of Applied Physics*, V. 22, No. 11, Nov. 1983, pp. L751-L753.

*Primary Examiner*—Gene Wan
*Attorney, Agent, or Firm*—Hill, Van Santen, Steadman & Simpson

[57] ABSTRACT

The semiconductor laser, which can be either electrically or optically pumped, characterized by quantum well structure for the body and by having a distance of the respective mirror structures from the end of the laser active zone which is dimensioned within tight limits. The structure provides a semiconductor laser in which problems with destruction or aging of the reflective properties of the mirror structure due to heating are reduced.

12 Claims, 2 Drawing Figures

SEMICONDUCTOR LASER FOR HIGH OPTICAL OUTPUT POWER WITH REDUCED MIRROR HEATING

BACKGROUND OF THE INVENTION

The present invention is directed to a semiconductor laser which may be either optically or electrically pumped and has a semiconductor body with a layer format having resonator mirror structures being provided on opposite end surfaces of the body and a laser active zone generating the laser radiation in response to pumping being disposed between the mirror structures and terminating at a distance from each of the mirror structures.

For semiconductor lasers or, respectively, laser diodes which, in particular, are designed for a high output power of the emitted laser radiation, it is known that there is a problem of heating the mirror surfaces of the optical resonator of the laser. This heating can considerably limit the performance capabilities of such a laser. When the maximum load allowed for heating the respective mirror surface is exceeded, there is either an abrupt ageing and destruction of the mirror or, respectively, a loss of a significant part of the reflective property. Considerable long-term ageing of the reflective properties can already be observed even at output powers that are considerably below the maximum load.

A gallium aluminum arsenide semiconductor laser, which is consctructed on the principle of "window structure" is disclosed in articles from *IEEE Journ. Quantum Electr.*, Vol. QE 15 (1979), p. 775; and *Appl. Phys. Letter*, Vol. 34 (1979), p. 367, and in U.S. Pat. No. 4,349,905, whose disclosure is incorporated by reference thereto. This structure provides that the laser-active zone or, respectively, the semiconductor body in the region of this laser-active zone given a double hetero-structure injection laser is divided by topically limited zinc diffusion into short n-doped and longer p-doped length segments. The mirror surfaces are provided in the region of the n-doped segments. The absorption of the laser radiation generated in the longer p-doped segments is considerably reduced in the n-doped segments so that the thermal load of the respective mirror surfaces can be reduced. However, the structure requires a more involved manufacture process for the diode.

A laser diode is disclosed in U.S. Pat. No. 4,371,966, whose disclosure is incorporated by reference thereto. This laser diode has mirrors adjacent to the semiconductor material, that is not to be pumped, but these mirrors belong to a waveguide structure that is passive overall. Again, such a structure requires a more involved manufacture process.

SUMMARY OF THE INVENTION

The object of the present invention is to provide a structure of a semiconductor laser with reduced thermal load of the resonator mirror surfaces which structure can be manufactured in a technologically simple fashion and with good reproducibility.

To accomplish these goals, the present invention is directed to an improvement in a semiconductor strip laser having a semiconductor body with a layer format, resonator mirror structures being provided on opposite end surfaces of the semiconductor body, and a laser active zone generating the laser radiation in response to pumping being disposed in the body between the mirror structures and terminating at a distance therefrom. The improvements include the layer format of the semiconductor body being a quantum well structure and the distance between each mirror structure and adjacent end of the laser active zone being in a range of 5 to 30 $\mu$m.

An article in *Jap. Journ. Appl. Physics*, Vol. 22, 1983, L-751-L753, shows a semiconductor laser with a "quantum well" structure at which a determination has been made that the absorption of the laser radiation generated in the pumped regions thereof is lower in the optionally unpumped regions of this laser than is the case of conventional double-hetero structures. However, this article does not show a relationship of the resonator mirrors surfaces relative to the pumped and unpumped regions. This perception is used in the invention in that a respective unpumped region is provided in the semiconductor material, namely limited to a tight dimensional proximity of the mirror structure of the optical resonator. The relatively low absorption of the laser radiation in the unpumped region in such a laser structure leads to only a low charge carrier concentration in the region of the mirror structure. The length dimension of the unpumped region adjacent to the respective mirror structure is dimensioned in the invention so that a significant loss of outut power of the overall semiconductor laser, i.e. the pumped laser region, does not yet occur but, on the other hand, so that the heat generated in the region of the respective mirror structure or surface remains within the range of the degree allowable for the respective mirror structure. The length of the respective unpumped region, i.e. the respective distance between the mirror structure and the end of the laser-active zone is dimensioned to be in a range of 5 to 30 $\mu$m, and preferably in a range of 10 to 15 $\mu$m in accordance to the present invention.

The dimension of the optimum length of the umpumped region of the semiconductor body of the laser adjacent to the respective mirror structure is, for example, limited to about three diffusion lengths of the charge carriers, particularly the holes, in the unpumped regions of the active zone. As indicated, this applies directly to optically pumped semiconductor lasers. In contrast an additional spread of the charge carrier profile of about 2 $\mu$m in the track region of the laser would have to be added given injection lasers.

Additional advantanges will be readily apparent from the accompaning drawings, specification and claims.

DESCRIPTION OF THE PREFERRED EMBODIMENTS

Figure 1:
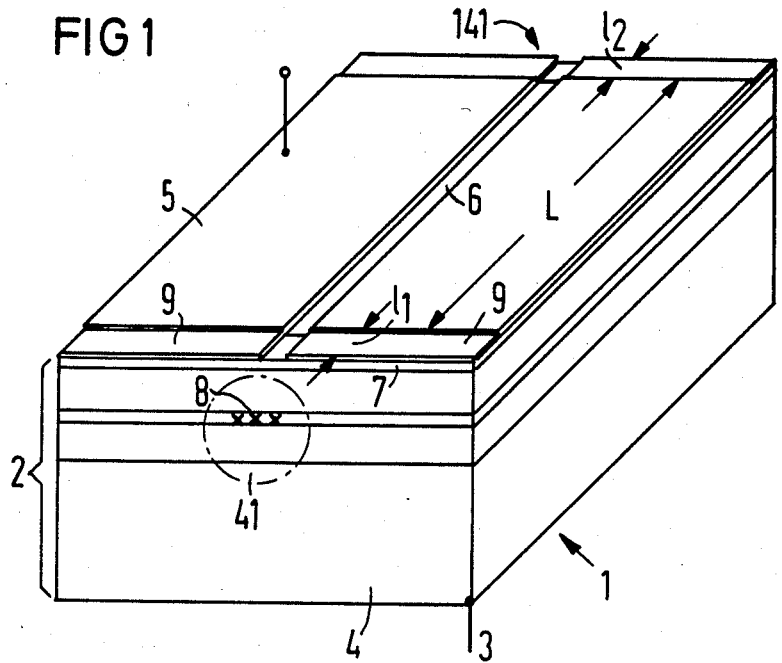
FIG. 1 is a perspective view of a semiconductor strip laser according to the invention.

The principles of the present invention are particularly useful in a injection semiconductor diode, generally indicated at 1 in FIG. 1. The laser diode 1 has a body structure of a layer format 2, which is known as particularly being epitaxially produced of a plurallity of layers. One electrode terminal 3, for example, is applied to a layer or part 4 of the layer sequence 2, wherein the part 4, in particular, is the substrate body of the diode 1. A cooperating electrode is a nearly flat surface-wide metal 5 coating on an upper surface of the diode 1. As illustrated, the metal coating 5 extends into a strip-shaped depression 6, which may be seen in FIG. 1 and lies on the uppermost layer 7 of the semiconductor material of the layer sequence or format 2. The structure of the depression 6 defines a strip-shape and position of the laser-active zone or strip whose cross sectional surface in the region of the illustrated insert is shown in a cross hatched section 8. An optical resonator with a resonator mirror structure 41 and 141 are present and are placed on the end faces at the front and back of the diode as illustrated in FIG. 1, and are either based on the refractive index of the material of the semiconductor body or, on a layer sequence 2 and as a consequence of additional mirroring of these surfaces provided in a known fashion.

Two strip-shaped coatings 9 of electrical insulating material such as for example, aluminum oxide, are provided on the semiconductor material layer 7 so that the metal coating 5 does not come in contact with the semiconductor material of the layer 7. As a consequence of the length of the metal coating, which has a length L, the injection excitation in the region of the laser-active zone, which has the cross sectional surface 8, is also limited to this length and the distances or length components $l_1$ and $l_2$ are present at both opposite ends of the laser-active zone and are the unpumped sub-regions of the laser-active zone. Thus the length component of the optical resonator in which no laser radiation is generated but reduced absorption of the laser radiation occurs in accordance with the present invention would be in the sub-regions having the length $l_1$, $l_2$ and the total length of the diode 1 is equal to L plus $l_1$ plus $l_2$. As a consequence of the reduced absorption, the heating in the region of the front-end surface of a resonator mirror 41 of the body of the diode 1 is lower than would be the case if the dimension L were equal to the full length of th body of the diode 1. The same is true of the opposite end face for the mirror 141 due to this length L. As is almost always the case with laser diodes, these end faces or surfaces are the mirrors surfaces for the optical resonator of the laser diode 1 at the same time. The reduced thermal load of the mirror surfaces of the optical resonator of the laser diode is thus achieved with the described measure.

Figure 2:
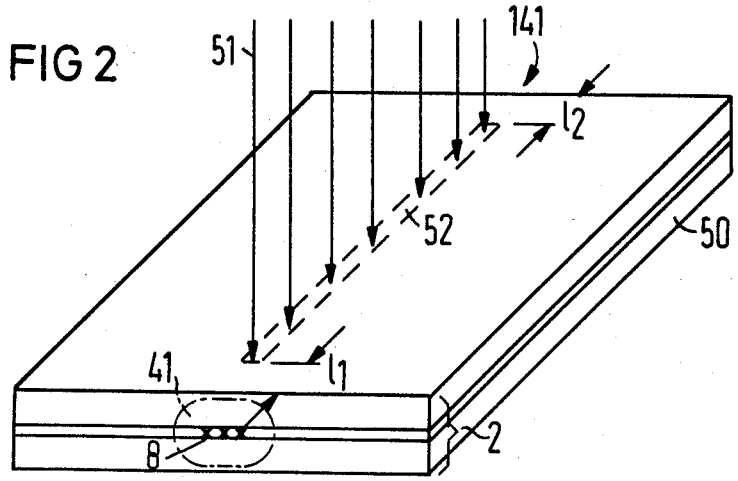
FIG. 2 is a perspective view of an embodiment of the semiconductor strip laser according to the invention.

An embodiment of the semiconductor laser 50 is illustrated in FIG. 2, and is pumped with optical radiation 51. Laser 50 also has a layered format 2 with a optically pumped subarea limited to a strip 52, which except for the spacings $l_1$ and $l_2$, extends up to the front and back end faces of the body of the laser. The sub-regions of the spacings $l_1$ and $l_2$ correspond to those of FIG. 1 and have the above-described effect with respect to the mirrors 41 and 141 of the optical resonator. The strip 52 can be defined by the demarcation of a correspondingly strip-shaped opening, for example, a mask lying on the semiconductor body.

Although various minor modifications may be suggested by those versed in the art, it should be understood that I wish to embody within the scope of the patent granted hereon, all such modifications that reasonably and properly come within the scope of my contribution to the art.

I claim:

1. In a semiconductor strip laser having a semiconductor body with a layer format, said body having resonator mirror structures being provided on opposite end surfaces of the body and a laser active zone generating a laser radiation in response to pumping being disposed between the mirror structures and having ends spaced inward at a distance from each mirror structure, the improvements comprising the layer format of the seimiconductor body comprising a quantum well structure and the respective distances between the ends of the laser active zone and the respective mirror structures in the semiconductor body being in a range of 5 to 30 $\mu$m.

2. In a semiconductor strip laser according to claim 1, wherein the laser is an electrically pumped laser and the body has an electrode coating, wherein the respective distances between the ends of the laser active zones and the mirror structures are defined by length limitations of the electrode coating on the body.

3. In a semiconductor strip laser according to claim 1, wherein the laser is an optically pumped laser and wherein the distances between the ends of the mirror structure and the ends of the laser active zone are defined by the length of a strip of the semiconductor body being irradiated with optical energy.

4. In a semiconductor strip laser according to claim 3, wherein the length of the strip being irradiated is limited by a mask.

5. In a semiconductor strip laser according to claim 1, wherein the respective distances are in a range of 10–15 $\mu$m.

6. In a semiconductor strip laser according to claim 5, wherein the laser is a electrically pumped laser and having electrode coatings and the length of the active zone is determined by a length of one of the electrode coating.

7. In a semiconductor strip laser according to claim 5, wherein the laser is an optically pumped laser and the length of the laser active zone is determined by the length of the semiconductor body being irradiated with optical energy.

8. In a semiconductor laser according to claim 7, wherein the length of the body being irradiated by optical energy is determined by a mask.

9. In a semiconductor laser according to claim 1, wherein the respective distances between the ends of the laser active zone and the each mirror structure amounts to about three diffusion lengths of a charge carrier.

10. In a semiconductor strip laser according to claim 9, wherein the laser is an optically pumped laser and the length of the laser active zone is determined by the length of a strip of the semiconductor body being irradiated with optical energy.

11. In a semiconductor strip laser according to claim 9, wherein the laser is a electrically pumped laser having an electrode coating and wherein the length of the laser active zone is determined by the length of the electrode coating.

12. In a semiconductor laser according to claim 11, wherein the respective distance between the mirror structure and the end of the laser active zone amounts to an additional 2 $\mu$m to the three diffusion lengths of a charge carrier.

* * * * *